United States Patent
Nakamura

(10) Patent No.: US 9,932,946 B2
(45) Date of Patent: Apr. 3, 2018

(54) MULTI-LAYER PIEZOELECTRIC ELEMENT, AND PIEZOELECTRIC ACTUATOR, INJECTION DEVICE, AND FUEL INJECTION SYSTEM PROVIDED WITH THE SAME

(75) Inventor: Shigenobu Nakamura, Kyoto (JP)

(73) Assignee: Kyocera Corporation, Kyoto (JP)

( * ) Notice: Subject to any disclaimer, the term of this patent is extended or adjusted under 35 U.S.C. 154(b) by 1008 days.

(21) Appl. No.: 14/241,234

(22) PCT Filed: Aug. 27, 2012

(86) PCT No.: PCT/JP2012/071590
§ 371 (c)(1),
(2), (4) Date: May 2, 2014

(87) PCT Pub. No.: WO2013/031727
PCT Pub. Date: Mar. 7, 2013

(65) Prior Publication Data
US 2014/0245996 A1    Sep. 4, 2014

(30) Foreign Application Priority Data

Aug. 30, 2011    (JP) .................................. 2011-187286

(51) Int. Cl.
*H01L 41/083* (2006.01)
*F02M 51/06* (2006.01)
(Continued)

(52) U.S. Cl.
CPC ..... *F02M 51/0603* (2013.01); *H01L 41/0472* (2013.01); *H01L 41/0477* (2013.01);
(Continued)

(58) Field of Classification Search
CPC ............ F02M 51/0603; H01L 41/0472; H01L 41/0477; H01L 41/0533; H01L 41/083; H01L 41/273; H01L 41/293
(Continued)

(56) References Cited

U.S. PATENT DOCUMENTS 5,173,162 A * 12/1992 Hagimura ........... H01L 41/0472
                                                                204/492
9,698,333 B2 * 7/2017 Ozawa ................ H01L 41/0533
(Continued)

FOREIGN PATENT DOCUMENTS

JP    3-218688 A    9/1991
JP    7-116056 A    5/1995
(Continued)

OTHER PUBLICATIONS

International Search Report, PCT/JP2012/071590, dated Oct. 30, 2012, 1pg.
(Continued)

*Primary Examiner* — Thomas Dougherty
(74) *Attorney, Agent, or Firm* — Volpe and Koenig, P.C.

(57) ABSTRACT

There are provided a multi-layer piezoelectric element in which an increase of oxygen vacancies in an electric-field concentration part of piezoelectric layers is suppressed and a decrease of an amount of displacement is suppressed, as well as to provide a piezoelectric actuator, an injection device and a fuel injection system provided with the multi-layer piezoelectric element. A multi-layer piezoelectric element includes a stacked body composed of piezoelectric layers and internal electrode layers which are stacked on each other, and a resin which evolves OH⁻ when being heated. Accordingly, it is possible to obtain a multi-layer piezoelectric element in which an increase of oxygen vacancies in an electric-field concentration part of piezoelectric layers is suppressed and a decrease of an amount of displacement is suppressed.

13 Claims, 11 Drawing Sheets

(51) Int. Cl.
*H01L 41/273* (2013.01)
*H01L 41/293* (2013.01)
*H01L 41/047* (2006.01)
*H01L 41/053* (2006.01)
*H01L 41/187* (2006.01)

(52) U.S. Cl.
CPC ........ *H01L 41/0533* (2013.01); *H01L 41/083* (2013.01); *H01L 41/273* (2013.01); *H01L 41/293* (2013.01); *H01L 41/1876* (2013.01)

(58) Field of Classification Search
USPC .................................................. 310/340, 366
See application file for complete search history.

(56) References Cited

U.S. PATENT DOCUMENTS

| | | | | |
|---|---|---|---|---|
| 2002/0053860 | A1* | 5/2002 | Mitarai | H01L 41/0472 310/366 |
| 2006/0279173 | A1* | 12/2006 | Kimura | H01L 41/273 310/328 |
| 2007/0069610 | A1* | 3/2007 | Ono | H01L 41/273 310/328 |
| 2007/0176521 | A1* | 8/2007 | Nakamura | F02M 51/0603 310/366 |
| 2007/0273251 | A1 | 11/2007 | Okamura et al. | |
| 2009/0107698 | A1* | 4/2009 | Cheng | H01L 41/0533 174/138 R |
| 2009/0152991 | A1* | 6/2009 | Goat | H01L 41/053 310/344 |
| 2009/0220765 | A1 | 9/2009 | Okamura et al. | |
| 2010/0282874 | A1 | 11/2010 | Nakamura et al. | |
| 2010/0320284 | A1 | 12/2010 | Okamura | |
| 2012/0024980 | A1* | 2/2012 | Nakamura | H01L 41/0472 239/88 |
| 2012/0187211 | A1 | 7/2012 | Nakamura | |
| 2013/0018266 | A1* | 1/2013 | Nishikubo | A61B 8/4483 600/443 |
| 2014/0026858 | A1* | 1/2014 | Okamura | F02M 51/0603 123/456 |

FOREIGN PATENT DOCUMENTS

| | | |
|---|---|---|
| JP | 2001135872 A | 5/2001 |
| JP | 2011-003574 A | 1/2011 |
| WO | 2007049697 A1 | 5/2007 |
| WO | 2007097460 A1 | 8/2007 |
| WO | 2009069746 A1 | 6/2009 |
| WO | 2011/013689 A1 | 2/2011 |

OTHER PUBLICATIONS

Extended European Search Report, European Patent Application No. 12827450.3, dated May 12, 2015, 5 pgs.

Japanese Office Action with English concise explanation, Japanese Patent Application No. 2013-531302, dated Dec. 2, 2014, 5 pgs.

* cited by examiner

FIG. 8
(a)
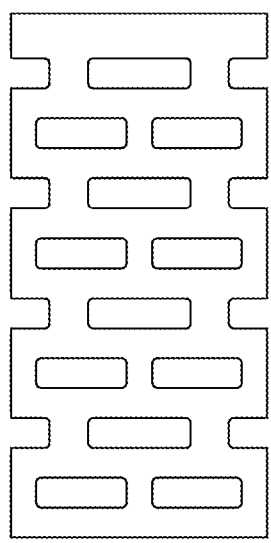
(c)
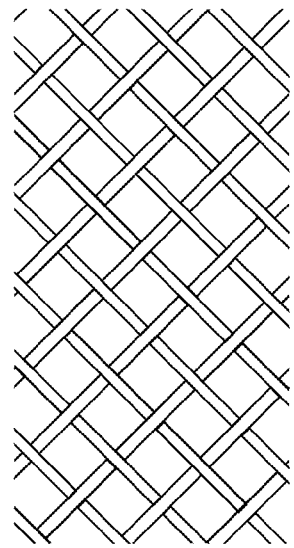
(b)
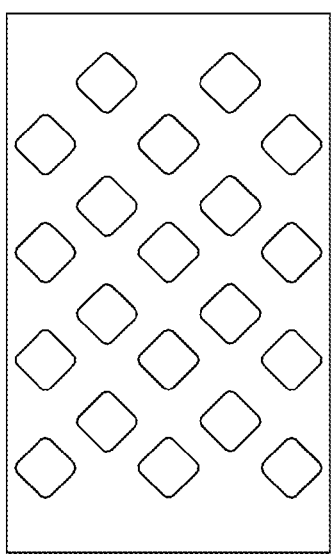
(d)
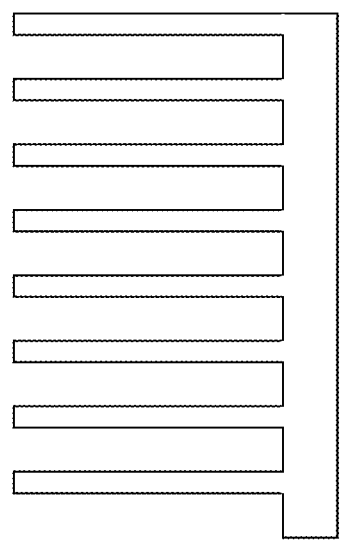

MULTI-LAYER PIEZOELECTRIC ELEMENT, AND PIEZOELECTRIC ACTUATOR, INJECTION DEVICE, AND FUEL INJECTION SYSTEM PROVIDED WITH THE SAME

FIELD OF INVENTION

The present invention relates to a multi-layer piezoelectric element used for, for example, a piezoelectric driving element (piezoelectric actuator), a pressure sensor element, a piezoelectric circuit element, and so forth, as well as to an injection device and a fuel injection system provided with the multi-layer piezoelectric element.

BACKGROUND

A multi-layer piezoelectric element basically comprises a stacked body composed of piezoelectric layers and internal electrode layers which are stacked on each other, with the end faces of the internal electrode layers extended to a side face of the stacked body (refer to Patent Literature 1). In addition, a metallized electrode is attached to the side face of the stacked body so as to be electrically connected to the internal electrode layers, and a lead member is fixedly connected to the metallized electrode by solder, an electrically-conductive bonding material (electrically-conductive adhesive), or the like.

CITATION LIST

Patent Literature

Patent Literature 1: Japanese Unexamined Patent Publication JP-A 2001-135872

SUMMARY

Technical Problem

However, when the multi-layer piezoelectric element is continuously driven in high-temperature conditions, for example, when it is used as an actuator for an automotive fuel injector, oxygen vacancies in the piezoelectric layers undergo migration so as to move toward a part where electric fields are concentrated, in consequence whereof there results an increase of lattice defects in that part and ensuing deterioration of the piezoelectric characteristics of the piezoelectric layers, which ends in the problem of a decrease of the amount of displacement in the multi-layer piezoelectric element.

The invention has been devised in view of the circumstances as mentioned supra, and accordingly an object of the invention is to provide a multi-layer piezoelectric element in which an increase of oxygen vacancies in an electric-field concentration part of piezoelectric layers is suppressed and a decrease of an amount of displacement is suppressed, as well as to provide a piezoelectric actuator, an injection device and a fuel injection system provided with the multi-layer piezoelectric element.

Solution to the Problem

The invention provides a multi-layer piezoelectric element comprising: a stacked body composed of piezoelectric layers and internal electrode layers which are stacked on each other; and a resin which evolves OH⁻ when being heated.

In the invention, it is preferable that the multi-layer piezoelectric element comprises a metallized electrode attached to a side face of the stacked body so as to be electrically connected to the internal electrode layers, and the resin is disposed to a surface of the metallized electrode.

Moreover, in the invention, it is preferable that the multi-layer piezoelectric element comprises a metallized electrode attached to a side face of the stacked body so as to be electrically connected to the internal electrode layers; and an electrically-conductive bonding material and a lead member that are electrically connected to the metallized electrode, and the electrically-conductive bonding material contains a conducting material and the resin.

Moreover, in the invention, it is preferable that the multi-layer piezoelectric element comprises an electrically-conductive bonding material and a lead member that are attached to a side face of the stacked body so as to be electrically connected to the internal electrode layers, and the electrically-conductive bonding material contains a conducting material and the resin.

The invention provides a piezoelectric actuator comprising: the multi-layer piezoelectric element mentioned above; and a case for accommodating the multi-layer piezoelectric element in its interior.

The invention provides an injection device comprising: a container provided with an injection hole; and the multi-layer piezoelectric element mentioned above, a fluid stored in the container being injected through the injection hole by driving the multi-layer piezoelectric element.

The invention provides a fuel injection system comprising: a common rail configured to store a high-pressure fuel; the above-mentioned injection device configured to inject the high-pressure fuel stored in the common rail; a pressure pump configured to supply the high-pressure fuel to the common rail; and an injection control unit configured to send driving signals to the injection device.

Advantageous Effect of Invention

According to the multi-layer piezoelectric element of the invention, since the resin which evolves OH⁻ when being heated is provided, by the action of resultant OH⁻ oxygen can be supplied to the piezoelectric layers, wherefore it is possible to suppress an increase of oxygen vacancies in an electric-field concentration part of the piezoelectric layers, and thereby suppress a decrease of the amount of displacement. Particularly advantageously, since effective oxygen supply can be achieved even when the multi-layer piezoelectric element is used in high-temperature conditions during which period oxygen vacancies are likely to move toward the electric-field concentration part, it is possible to suppress an increase of oxygen vacancies in the electric-field concentration part.

BRIEF DESCRIPTION OF THE DRAWINGS

FIG. 8 is a schematic front view showing an example of a lead member constituting the multi-layer piezoelectric element of the invention;

DETAILED DESCRIPTION OF THE PREFERRED EMBODIMENTS

Hereinafter, a multi-layer piezoelectric element in accordance with one embodiment of the invention will be described in detail with reference to the drawings.

Figure 1:
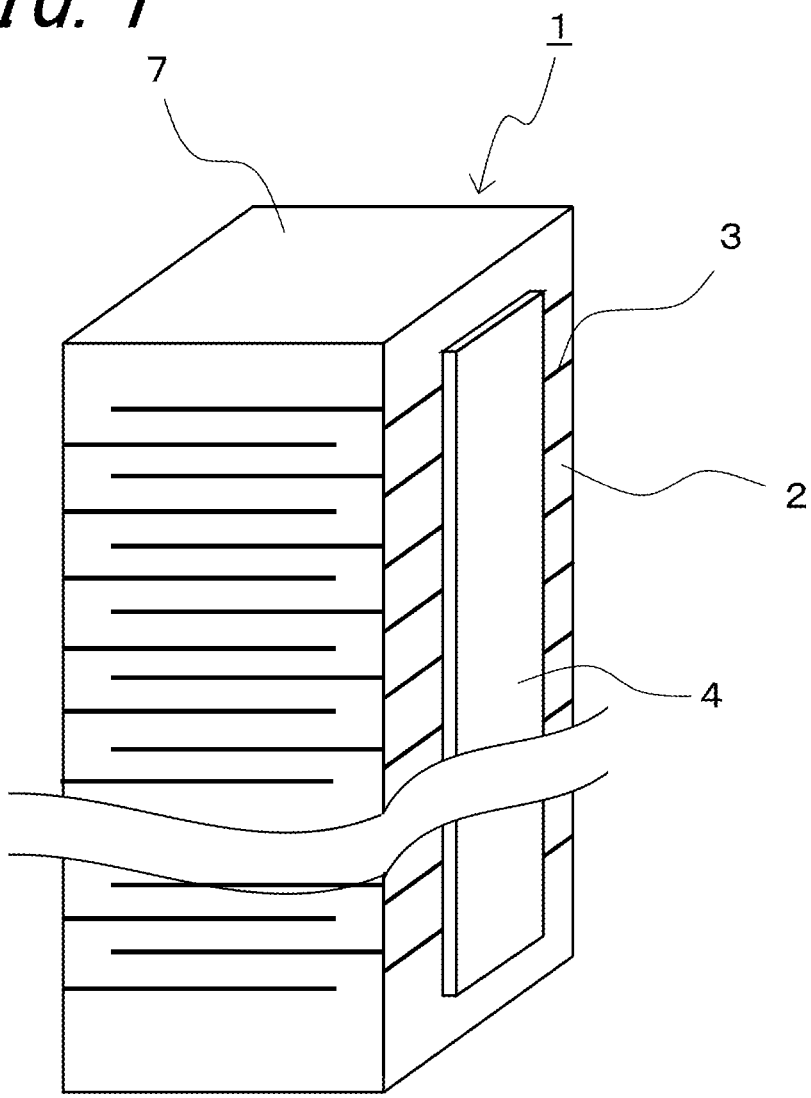
FIG. 1 is a perspective view showing a multi-layer piezoelectric element in accordance with one embodiment of the invention.

FIG. 1 is a perspective view showing one embodiment of the invention, and the multi-layer piezoelectric element 1 as shown in FIG. 1 comprises: a stacked body 7 composed of piezoelectric layers 2 and internal electrode layers 3 which are stacked on each other; and a resin, and the resin evolves $OH^-$ when being heated.

With respect to the stacked body 7 constituting the multi-layer piezoelectric element 1, for example, piezoelectric layers 2 and internal electrode layers 3 are alternately stacked on each other, and, the internal electrode layers 3 are formed by arranging positive electrodes and negative electrodes in alternate order. The stacked body 7 has a rectangular parallelepiped form which is, for example, 0.5 to 10 mm in length, 0.5 to 10 mm in width, and 1 to 100 mm in height.

The piezoelectric layer 2 constituting the stacked body 7 is made of piezoelectric ceramic having piezoelectric property, and, for example, a perovskite-type oxide such as $PbZrO_3$—$PbTiO_3$ (lead zirconate titanate) can be used therefor. The piezoelectric layer 2 has a thickness in a range of 3 μm to 250 μm, for example.

Moreover, the internal electrode layers 3 constituting the stacked body 7 are stacked in alternate relation to the piezoelectric layers 2 in a manner such that one piezoelectric layer 2 is sandwiched between upper-located and lower-located internal electrode layers 3, and in which positive electrodes and negative electrodes are arranged according to the stacking order, so that a driving voltage can be applied to the piezoelectric layer 2 sandwiched between the positive and negative electrodes. The internal electrode layer 3 is made of a metal such for example as a silver-palladium (Ag—Pd) alloy, and, in this embodiment, the positive electrodes and the negative (or grounding) electrodes are led out to opposed side faces of the stacked body 7 in a staggered arrangement so as to be electrically connected to a pair of metallized electrodes 4 attached to the side faces of the stacked body 7. The internal electrode layer 3 has a thickness in a range of 0.1 μm to 5 μm, for example. Note that, although FIG. 1 shows a configuration in which the positive electrodes and the negative (or grounding) electrodes of the internal electrode layers 3 extend to opposed side faces of the stacked body 7 free of the subsequently-described metallized electrode 4, it is possible to adopt a configuration in which the positive electrodes and the negative (or grounding) electrodes of the internal electrode layers 3 are not extended to the metallized electrode 4-free opposed side faces of the stacked body 7 (a configuration in which the ends of the internal electrode layers 3 are left unexposed).

Moreover, a pair of metallized electrodes 4 is disposed on the side faces of the stacked body 7. The paired metallized electrodes 4, which are formed for example by application of a paste made of silver and glass with subsequent baking treatment, are attached to the side faces of the stacked body 7 so as to be electrically connected to the internal electrode layers 3 led out to opposed side faces of the stacked body 7 in a staggered arrangement. The metallized electrode 4 has a thickness in a range of 5 μm to 100 μm, for example.

The multi-layer piezoelectric element 1 further includes a resin which evolves $OH^-$ when being heated. For example, in the embodiment shown in FIG. 1, the resin which evolves $OH^-$ when being heated is disposed to the surface of the metallized electrode 4. In this description, the term "when being heated" is used to indicate a case where the resin is heated at an environmental temperature when used in high-temperature environmental conditions or a case where the resin is subjected to heat generated during operation of the multi-layer piezoelectric element 1, or is interpreted as including both of the cases, and the heating temperatures range from 200° C. to 270° C., for example.

For example, polyimide resin or polyamide resin with an unreacted component left therein can be used as the resin which evolves $OH^-$ when being heated. That is, in the case of using an incompletely-imidized or incompletely-amidated resin, since an imidization or amidation reaction occurs during use in high-temperature conditions, it follows that $OH^-$ is produced as a by-product of the reaction. For example, in the case of using an imide-series resin, by adjusting the resin to have a carboxyl group (—COOH) and an imino group (—NH) as unreacted components, the carboxyl group and the imino group bring about a ring-closure condensation reaction as will be expressed by the following formula during use in high-temperature conditions, with consequent production of $OH^-$ and $H^+$.

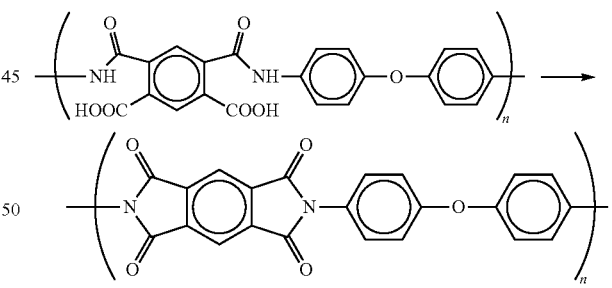

The $OH^-$ is adsorbed on the resin 5 ready to react with $H^+$.

Meanwhile, oxygen vacancies $V_o$.. are developed in the interior of the piezoelectric layer 2 by the following reaction.

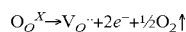

In continuous driving in high-temperature conditions, the oxygen vacancies tend to move toward an electric-field concentration part of the piezoelectric layers 2. In this regard, when the oxygen vacancies and $OH^-$ exist in proximity to each other, then the negatively-charged $OH^-$ and positively-charged oxygen vacancies combine with each other to eliminate the oxygen vacancies. By virtue of this reaction, it is possible to suppress an increase of oxygen vacancies in the electric-field concentration part due to movement (migration) of oxygen vacancies toward that part, and thereby suppress a decrease of the amount of displacement.

In the embodiment shown in FIG. 1, the resin which evolves OH⁻ when being heated is disposed to the surface of the metallized electrode 4. According to this configuration, oxygen can be effectively supplied to the piezoelectric layers 2 located near the metallized electrode 4 where oxygen vacancies are likely to increase due to concentration of electric fields. In the invention, although there is no particular limitation to the position of the resin for the supply of oxygen, in order to achieve effective oxygen supply to the close-to-metallized-electrode 4 piezoelectric layers 2 susceptible to electric-field concentration, it is advisable to apply the resin to the surface of the metallized electrode 4 as practiced in this embodiment, or to the side face of the stacked body located near the metallized electrode 4.

In the case of using an imide-series resin as the resin, even after long-term continuous use in high-temperature conditions, it never occurs that the resin is pyrolytically degraded, wherefore high reliability can be ensured for a long period of time. This advantage can be attributed to high heat resistance of an imide-series resin. In the configuration shown in FIG. 1, given that an imide-series resin is used as the resin which is disposed to the surface of the metallized electrode 4, the rate of imidization should preferably fall in a range of 80% to 98% for effect.

Figure 2:
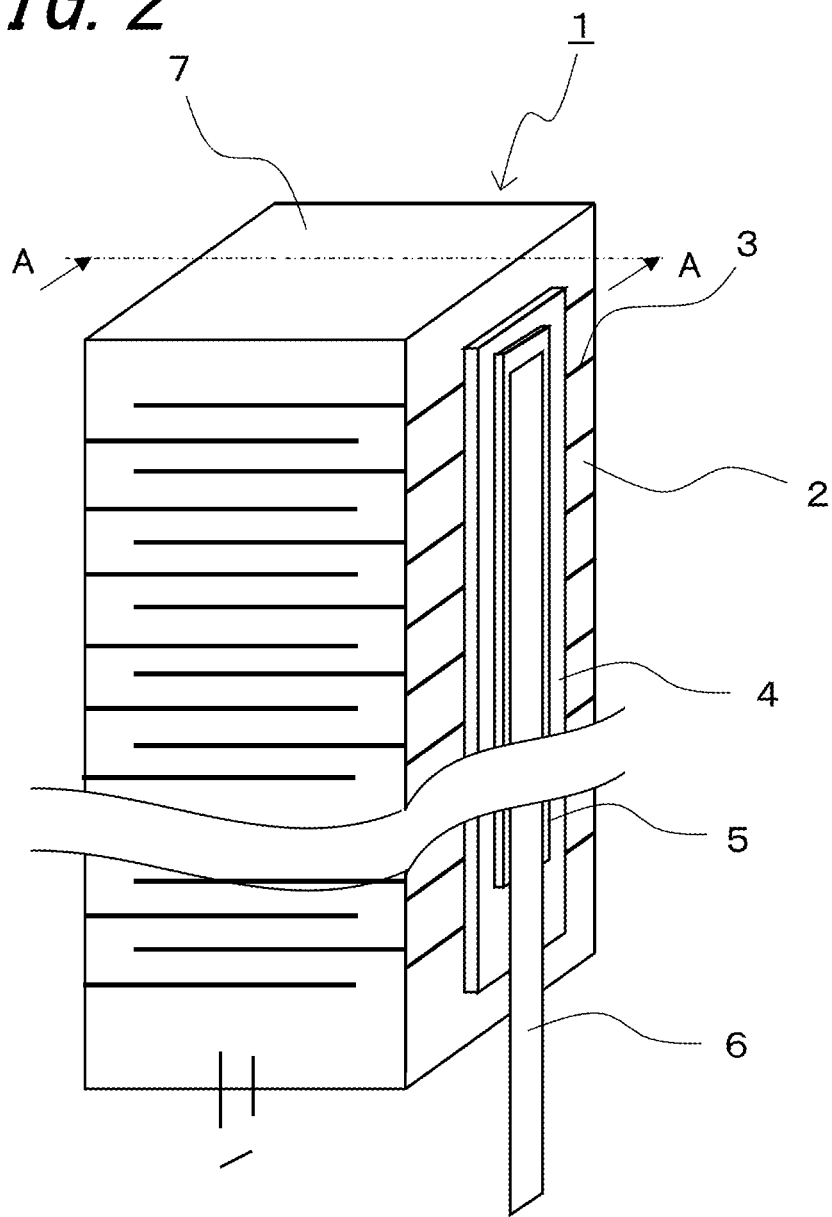
FIG. 2 is a perspective view showing a multi-layer piezoelectric element in accordance with another embodiment of the invention.
Figure 3:
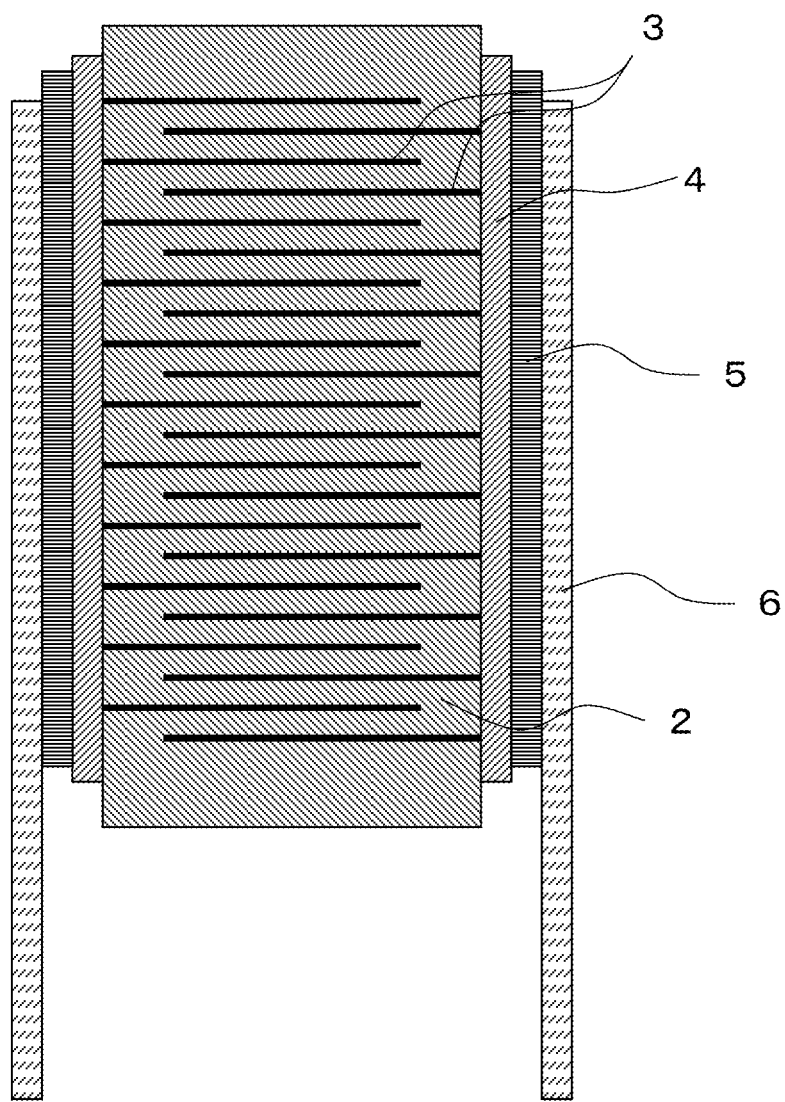
FIG. 3 is a sectional view taken along the line A-A shown in FIG. 2.

Moreover, as shown in FIGS. 2 and 3, the multi-layer piezoelectric element 1 may be provided with, as constituent components for the passage of greater electric current, an electrically-conductive bonding material 5 and a lead member 6 electrically connected to the metallized electrode 4. In this configuration, it is preferable that a conducting material and a resin which evolves OH⁻ when being heated are contained in the electrically-conductive bonding material 5.

This makes it possible to achieve effective oxygen supply to the close-to-metallized-electrode 4 piezoelectric layers 2 susceptible to electric-field concentration and ensuing increase of oxygen vacancies, and also, by passing electric current through the electrically-conductive bonding material 5 to supply power to the metallized electrode 4, it is possible to produce OH⁻ effectively under Joule heat generation, and thereby achieve more effective oxygen supply. Also in the configuration shown in FIGS. 2 and 3, given that an imide-series resin is used as the resin which is contained in the electrically-conductive bonding material 5, the rate of imidization should preferably fall in a range of 80% to 98% for effect.

Figure 4:
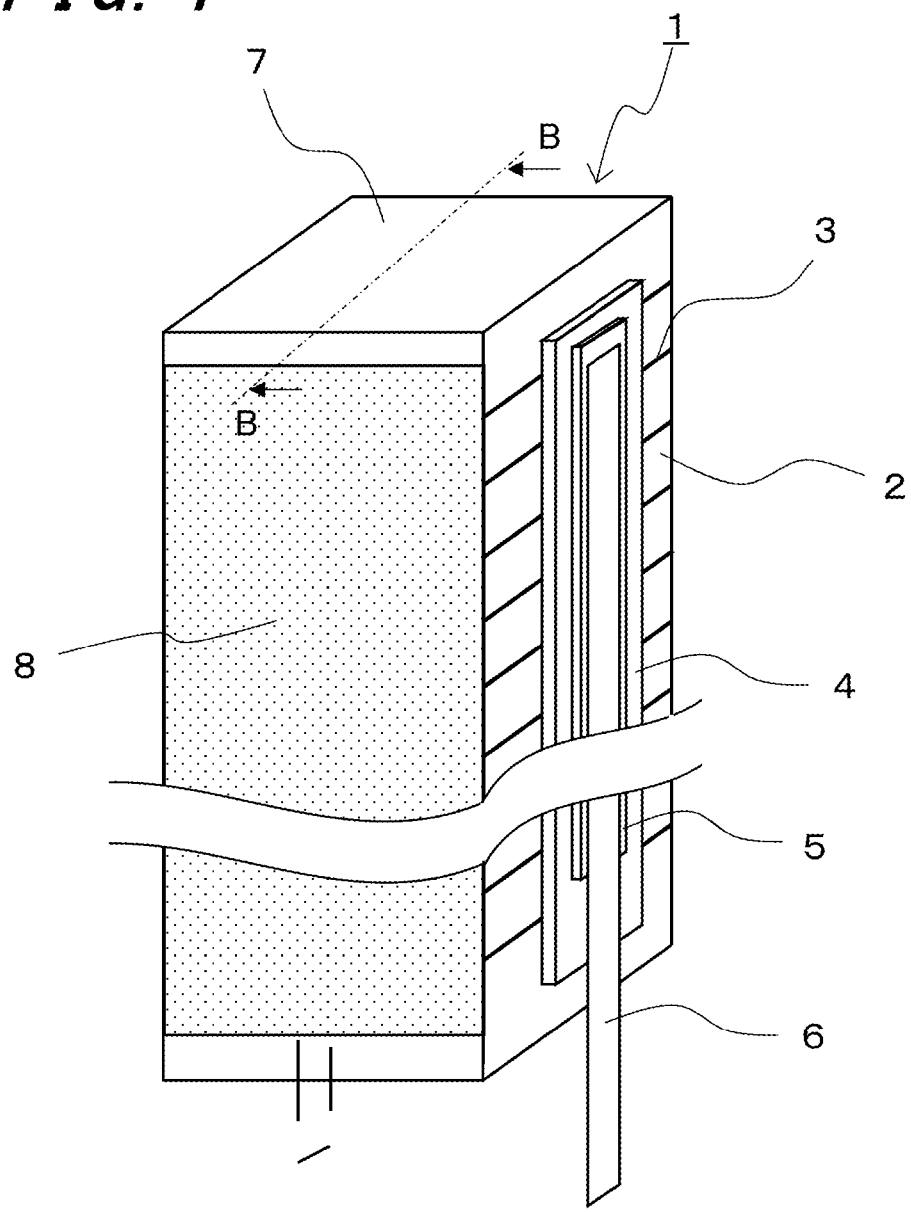
FIG. 4 is a perspective view showing a multi-layer piezoelectric element in accordance with another embodiment of the invention.
Figure 5:
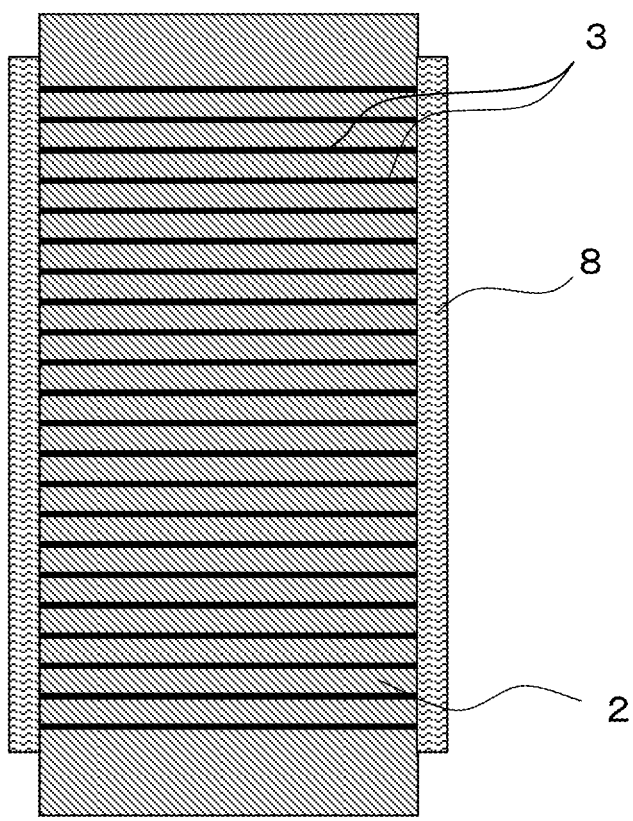
FIG. 5 is a sectional view taken along the line B-B shown in FIG. 4.

Moreover, as shown in FIGS. 4 and 5, in addition to the constituent components as shown in FIGS. 2 and 3, the multi-layer piezoelectric element 1 may be provided with a protective layer 8 made of resin, ceramics, or the like that is deposited on the side face of the stacked body 7 to prevent occurrence of electrical discharge at the side face of the stacked body 7 to which are extended the positive electrodes and the negative (or grounding) electrodes of the internal electrode layers 3. Furthermore, although not shown in the figures, the protective layer 8 may be deposited also on the side face of the stacked body 7 at which is disposed the metallized electrode 4 to prevent migration of metal components contained in the metallized electrode 4.

In this configuration, it is preferable that the protective layer 8 is made of a resin which evolves OH⁻ when being heated. By forming the protective layer 8 from a resin which evolves OH⁻ when being heated, it is possible to supply oxygen to the piezoelectric layers 2 from the side face of the stacked body 7, and thereby effectively suppress an increase of oxygen vacancies in an electric-field concentration part of the piezoelectric layers 2 during use in high-temperature conditions. Note that, although the boundary of the internal electrode layer-absent part and the internal electrode layer 3 (that is, the front end of the internal electrode layer 3 having no electrical connection with the metallized electrode 4) is notably susceptible to an increase of oxygen vacancies due to electric-field concentration, with the provision of a coating of a resin which evolves OH⁻ when being heated as the protective layer 8, an increase of oxygen vacancies can be suppressed effectively. Also in the configuration shown in FIGS. 4 and 5, given that an imide-series resin is used as the resin constituting the protective layer 8, the rate of imidization should preferably fall in a range of 80% to 98% for effect.

In a case where a protective layer 8 made of a formation material other than a resin which evolves OH⁻ when being heated is disposed to the side face to which are extended both the positive electrodes and the negative electrodes of the internal electrode layers 3, it is advisable to additionally provide a layer made of a resin which evolves OH⁻ when being heated on the surface of the protective layer 8 (one main surface opposite from the other located toward the stacked body 7). Moreover, where a protective layer 8 made of a formation material other than a resin which evolves OH⁻ when being heated is disposed to the side face to which are extended both of the positive electrodes and the negative electrodes of the internal electrode layers 3, it is advisable to additionally provide a layer made of a resin which evolves OH⁻ when being heated between the protective layer 8 and the side face of the stacked body 7, excluding a region where both electrodes are arranged in overlap relation in a stacking direction (a region where only the electrodes of the same polarity are arranged in overlap relation in the stacking direction).

Figure 6:
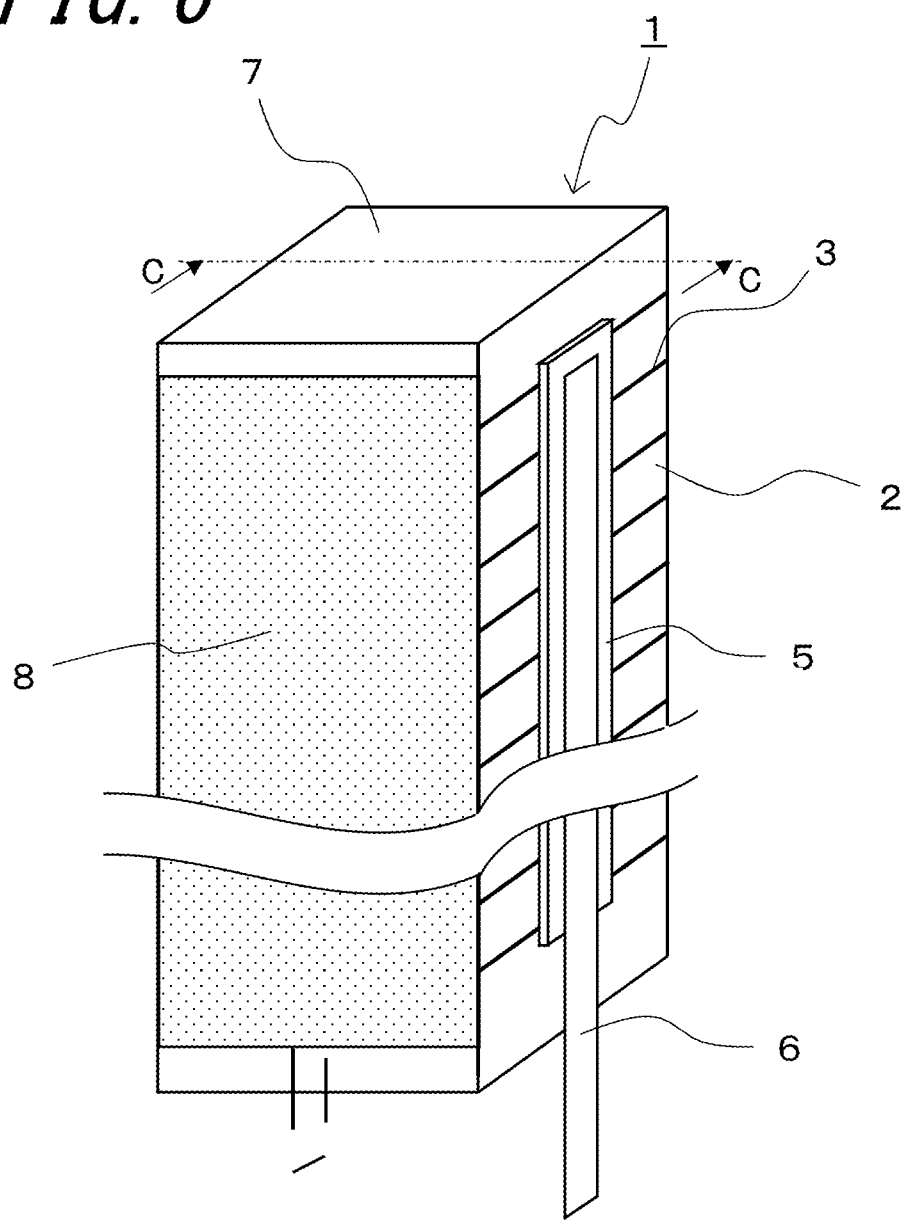
FIG. 6 is a perspective view showing a multi-layer piezoelectric element in accordance with another embodiment of the invention.
Figure 7:
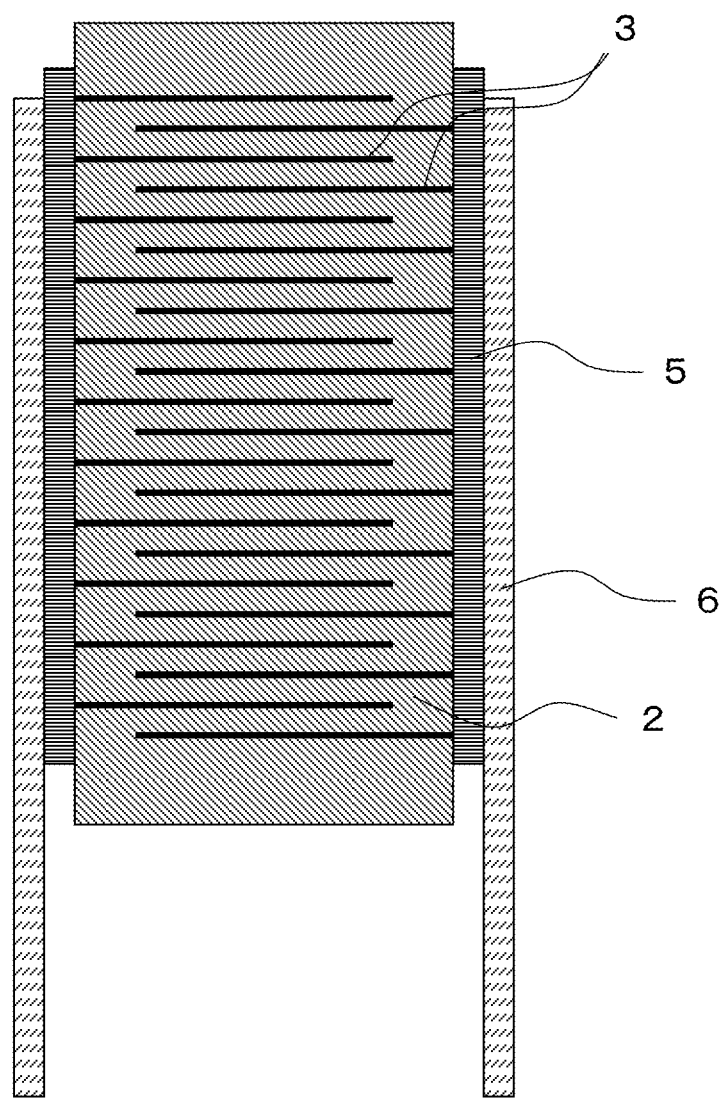
FIG. 7 is a sectional view taken along the line C-C shown in FIG. 6.

Although the foregoing embodiment has been described with respect to the case where the metallized electrode 4 is provided, as shown in FIGS. 6 and 7, it is possible to adopt a configuration which is based on the configuration as shown in FIG. 4, but in which the electrically-conductive bonding material 5 and the lead member 6 are attached directly to the side face of the stacked body 7 for electrical connection with the internal electrode layers 3 without providing the metallized electrode 4. Also in this case where the electrically-conductive bonding material 5 acts to ensure conduction with the internal electrode layers 3, it is preferable that a conducting material and a resin which evolves OH⁻ when being heated are contained in the electrically-conductive bonding material 5.

This allows, as with the case shown in FIGS. 2 and 3, effective oxygen supply to the piezoelectric layers 2 located near the electrically-conductive bonding material 5 that are susceptible to electric-field concentration and ensuing increase of oxygen vacancies, and also, by passing electric current through the electrically-conductive bonding material 5 to supply power to the internal electrode layers 3, it is possible to produce OH⁻ effectively under Joule heat generation, and thereby achieve more effective oxygen supply.

It is preferable that the conducting material contained in the electrically-conductive bonding material 5 is a metal having less ionization tendency than hydrogen, or an alloy of such a metal. To be specific, powder of a metal such as Ag, Au, Pt, Pd, etc., or an alloy thereof is desirable for use. So long as the conducting material contained in the electrically-conductive bonding material 5 is a metal having less ionization tendency than hydrogen, or an alloy of such a metal, since the conducting material is not subjected to oxidation in the presence of OH⁻ produced from the resin and therefore does not consume oxygen, it is possible to suppress an increase of oxygen vacancies in the electric-field concentration part of the piezoelectric layers 2 with oxygen produced from the resin.

Moreover, it is preferable that, as shown in FIG. 8, the lead member 6 is configured to be extendable and contractable in the stacking direction of the stacked body 7. The configuration shown in FIGS. 8(a) and 8(b) is obtained by making slits or holes in a metallic plate by means of punching or etching. The configuration shown in FIG. 8(c), which is of a metal-mesh structure, is obtained for example by weaving wire rods into mesh form in a manner such that the wire rods are arranged at an angle of about 45 degrees with respect to the stacking direction. The mesh may be either a plain-weave mesh or a twill-weave mesh. While the angle which the wire rod forms with the stacking direction is preferably about 45 degrees in the interest of facilitation of extension and contraction, any other angle may be adopted so long as the lead member can be made extensible and contractible (excluding 0 and 90 degrees). In addition, the configuration shown in FIG. 8(d) has the form of a comb-shaped wire rod with a common part for supplying electric current to each tooth-like portion of the comb-shaped wire rod.

In this way, by configuring the lead member 6 to be extendable and contractable in the stacking direction of the stacked body 7, it is possible to reduce a stress entailed by extension and contraction of the stacked body 7 at the time of fixing the lead member 6 to the metallized electrode 4 or the stacked body 7, and thereby suppress separation of the lead member 6 from the metallized electrode 4 or the stacked body 7 even after long-term use.

A DC electric field of 0.1 to 3 kV/mm is applied to the lead member 6 to initiate polarization in the piezoelectric layers 2 constituting the stacked body 7, whereby the multi-layer piezoelectric element 1 can be obtained. In this multi-layer piezoelectric element 1, the metallized electrode 4 and an external power source are connected to each other via the lead member 6 for application of driving voltage to the piezoelectric layers 2, so that each of the piezoelectric layers 2 can undergo significant displacement under an inverse piezoelectric effect. Thus, for example, the multi-layer piezoelectric element can be operated as an automotive fuel injection valve capable of supplying a jet of fuel into an engine.

According to the multi-layer piezoelectric element 1 thus far described, since OH⁻ generated from the resin during use in high-temperature conditions combines with oxygen vacancies developed in the piezoelectric layers 2 to eliminate the oxygen vacancies, it is possible to suppress an increase of oxygen vacancies in the electric-field concentration part caused by movement (migration) of oxygen vacancies toward the electric-field concentration part, and thereby provide a multi-layer piezoelectric element in which a decrease of the amount of displacement can be suppressed.

It should be understood that the application of the invention is not limited to the specific embodiments described heretofore, and that various changes and modifications are possible without departing from the scope of the invention. For example, although, in the embodiments described earlier, a single metallized electrode 4 is formed on each of two opposed side faces of the stacked body 7, two metallized electrodes 4 may be formed on the adjacent side faces of the stacked body 7, respectively, or may be formed on one and the same side face of the stacked body 7. Moreover, in a direction perpendicular to the stacking direction, the stacked body 7 may have, instead of a rectangular sectional profile as practiced in the foregoing embodiments, a sectional profile of any other polygonal shape such as a hexagonal or octagonal shape, or a circular sectional profile, or a sectional profile defined by a combination of a straight line and an arc.

For example, the multi-layer piezoelectric element 1 of the present embodiment can be used for a piezoelectric driving element (piezoelectric actuator), a pressure sensor element, a piezoelectric circuit element, and so forth. Examples of the driving element include a fuel injection device for an automotive engine, a liquid injection device such as an ink-jet system, a precise positioning apparatus such as an optical apparatus, and an anti-vibration apparatus. Examples of the sensor element include a combustion pressure sensor, a knocking sensor, an acceleration sensor, a load sensor, an ultrasound sensor, a pressure-detecting sensor, and a yaw-rate sensor. Moreover, examples of the circuit element include a piezoelectric gyroscope, a piezoelectric switch, a piezoelectric transformer, and a piezoelectric breaker.

Next, a method for manufacturing the multi-layer piezoelectric element 1 of the present embodiment will be described.

First of all, piezoelectric ceramic green sheets that constitute the piezoelectric layers 2 are prepared. More specifically, a ceramic slurry is prepared by mixing calcined powder of piezoelectric ceramics, a binder made of organic high polymer such as acrylic polymer or butyral polymer, and a plasticizer. Then, the ceramic slurry is shaped into piezoelectric ceramic green sheets by tape molding technique such as doctor blade method or calender roll method. The piezoelectric ceramics may be of any type so long as it has piezoelectric property, and, for example, a perovskite-type oxide made of lead zirconate titanate ($PbZrO_3$—$PbTiO_3$) can be used. Moreover, as the plasticizer, dibutyl phthalate (DBP), dioctyl phthalate (DOP), or the like can be used.

Next, an internal-electrode electrically conductive paste that constitutes the internal electrodes 3 is prepared. More specifically, the internal-electrode conductive paste is prepared by admixing a binder and a plasticizer in metal powder of a silver-palladium alloy. Note that a mixture of silver powder and palladium powder can be used instead of the silver-palladium alloy.

Subsequently, the internal-electrode conductive paste is disposed, in internal-electrode 3 pattern, to the aforementioned piezoelectric ceramic green sheets by means of screen printing, for example.

Next, a predetermined number of piezoelectric ceramic green sheets with the internal-electrode conductive paste are stacked on top of each other.

The resultant is subjected to binder removal treatment at a predetermined temperature, is fired at a temperature in a range of 900 to 1200° C., for example, and is ground at its side face into a predetermined shape by means of a surface grinder or otherwise. In this way, a stacked body 7 in which piezoelectric layers 2 and internal electrode layers 3 are alternately stacked on each other can be produced.

After that, the metallized electrode 4 is formed by printing a silver-glass electrically-conductive paste composed predominantly of silver and containing glass, in metallized-electrode 4 pattern, to the side face of the stacked body 7 where the internal electrode layers 3 are led out, with subsequent baking treatment being effected at a temperature in a range of 650 to 750° C., for example.

Next, a paste for forming the electrically-conductive bonding material is prepared. More specifically, the electrically-conductive bonding material-forming paste is prepared from a mixture of powder of metal having less ionization tendency than hydrogen, such as Ag, Au, Pt, Pd, etc., or an alloy thereof, a solvent such for example as N-methyl-2-pyrrolidone (NMP) or tetrahydrofuran (THF), and polyamic acid which is a precursor of polyimide.

After that, the electrically-conductive bonding material-forming paste is disposed to the surface of the metallized electrode 4, and the lead member 6 is placed thereon, with subsequent drying and curing treatment being effected at predetermined temperatures as will hereafter be described, whereby the lead member 6 can be fixedly connected to the metallized electrode 4 by the electrically-conductive bonding material 5.

At this time, the conducting material and the resin contained in the electrically-conductive bonding material 5 should preferably be mixed in a manner such that the proportion of the conducting material falls in a range of 15 to 80% by volume after the curing treatment. If the content of the conducting material is less than 15% by volume, particles of the conducting material cannot make contact with each other readily, wherefore the specific resistance of the electrically-conductive bonding material 5 is increased, which results in localized heat generation that occurs at the time of passing electric current. On the other hand, if the content of the conducting material is greater than 80% by volume, the content of the resin responsible for adhesion will be smaller relatively, wherefore it becomes impossible to maintain high adhesion strength, which results in accidental separation of the lead member 6.

Moreover, it is preferable that the particles of the conducting material have the form of non-spherical powder such as acicular powder or flaky powder. This is because, so long as being given non-spherical powdery form such as acicular powdery form or flaky powdery form, the particles of the conducting material can become tangled with each other to a larger extent than in the case of adopting substantially spherical powdery form, with the result that the shear strength of the electrically-conductive bonding material 5 can be greatly increased. Note that the non-spherical powder may be used in conjunction with substantially spherical powder.

In order for the electrically-conductive bonding material 5 in a cured state to include a resin which evolves OH⁻ when being heated, in the process of curing the electrically-conductive bonding material-forming paste as described earlier, it is advisable to carry out curing treatment for 10 to 60 minutes at a temperature at which the solvent of the electrically-conductive bonding material-forming paste is volatilized completely, but polyamic acid is not hundred-percent imidized, to be specific, a temperature in a range of 180 to 250° C. Whether or not the resin is of a type which evolves OH⁻ when being heated can be determined by examining the presence of a carboxyl group (—COOH) and an imino group (—NH) using an analytical method such as FT-IR spectroscopy.

It is noted that, by configuring the lead member 6 to be extendable and contractable in an extension-contraction direction of the stacked body 7, it is possible to avoid that a crack will be developed in the electrically-conductive bonding material during operation, causing the problem of separation of the lead member, and, the lead member of such a configuration can be obtained by boring holes or slits in a metallic plate, by designing a metal mesh so that constituent wire rods are arranged at an angle of about 45 degrees with respect to the extension-contraction direction, or by connecting a common part to metallic wire rods arranged substantially in parallel with the extension-contraction direction.

Next, a DC electric field of 0.1 to 3 kV/mm is applied to the lead member to initiate polarization in the piezoelectric layers 2 constituting the stacked body 7, whereby the multi-layer piezoelectric element 1 can be completed.

In implementing the embodiment in which no metallized electrode 5 is provided, the process of forming the metallized electrode 4 is left out.

Moreover, in the case of forming the protective layer 8 on the side face of the stacked body 7 using a resin which evolves OH⁻ when being heated, the protective layer 8 can be obtained by application of a coating of protective layer-forming paste made of a mixture of a solvent and polyamic acid which is a precursor of polyimide by means of screen printing, dipping, spin coating, spraying, or otherwise, with subsequent drying and curing treatment being effected at a predetermined temperature. In this way, the protective layer 8 can be formed from a resin which evolves OH⁻ when being heated.

In order for the protective layer 8 in a cured state to include a resin which evolves OH⁻ when being heated, in the process of curing the aforementioned protective layer-forming paste, it is advisable to carry out curing treatment for 10 to 60 minutes at a temperature at which the solvent of the protective layer-forming paste is volatilized completely, but polyamic acid is not hundred-percent imidized, to be specific, a temperature in a range of 180 to 250° C. Whether or not the resin is of a type which evolves OH⁻ when being heated can be determined by examining the presence of a carboxyl group (—COOH) and an imino group (—NH) using an analytical method such as FT-IR spectroscopy.

Figure 9:
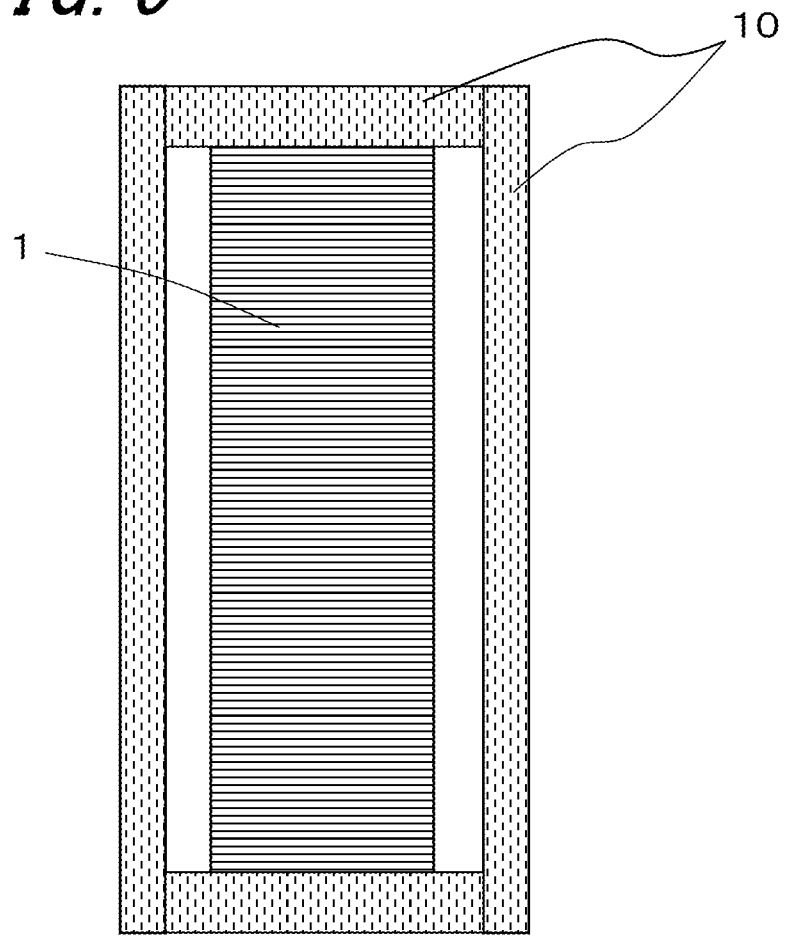
FIG. 9 is a schematic sectional view showing a piezoelectric actuator pursuant to the invention.

Next, a piezoelectric actuator in accordance with the embodiment of the invention will be described. FIG. 9 is a schematic sectional view showing an embodiment of the piezoelectric actuator pursuant to the invention, and, the piezoelectric actuator as shown in FIG. 9 comprises a case 10 and the multi-layer piezoelectric element 1 accommodated in the case 10.

The case 10 is made of a metal material such as SUS 304 or SUS 316L, and, the multi-layer piezoelectric element 1, being sealed in such a case 10, can be used in a corrosive gas and in water as well, for example. Moreover, the sealing may be made using an inert gas for the sake of preventing ion migration in the internal electrode layer 3. In this case, although oxygen vacancies tend to be generated in the piezoelectric layer 2 due to a paucity of oxygen, by the use of the multi-layer piezoelectric element 1 of the invention, it is possible to achieve effective oxygen supply from resin even in an enclosed space within the case 10, and thereby suppress generation of oxygen vacancies in the piezoelectric layer 2.

Figure 10:
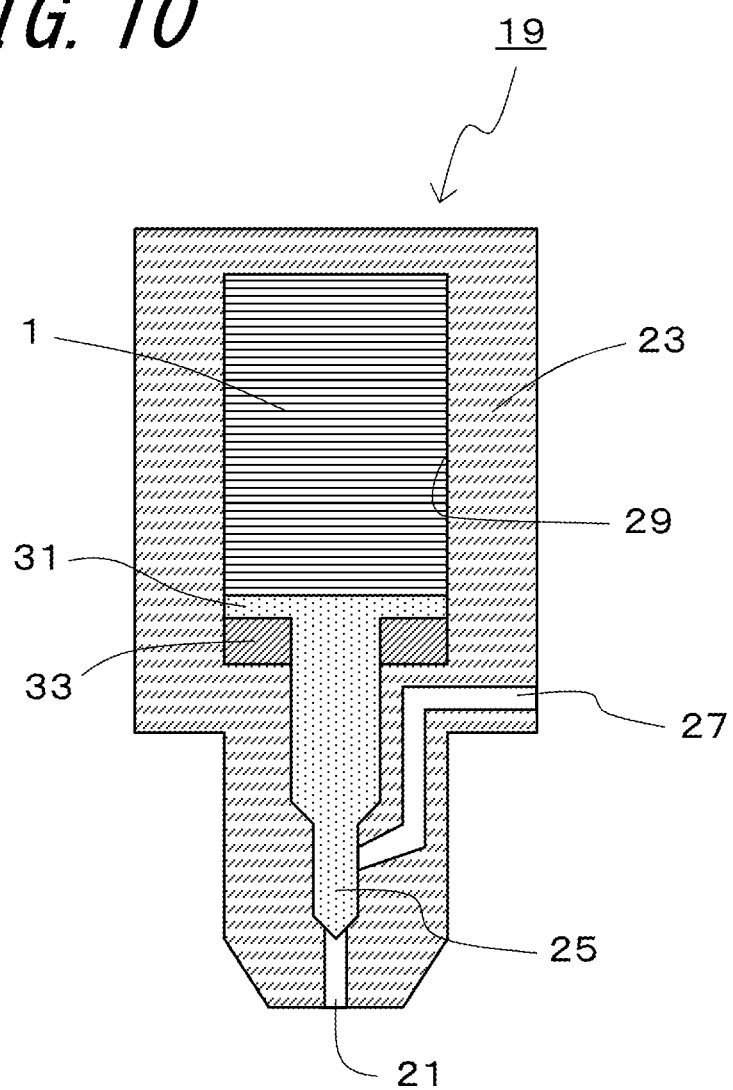
FIG. 10 is a schematic sectional view showing an injection device in accordance with one embodiment of the invention.

Next, an injection device in accordance with the embodiment of the invention will be described. FIG. 10 is a schematic sectional view showing an injection device in accordance with one embodiment of the invention.

As shown in FIG. 10, the injection device 19 of this embodiment includes a housing (container) 23 provided with an injection hole 21 at one end thereof and the multi-layer piezoelectric element 1 of the foregoing embodiment in the housing 23.

In an interior of the housing 23 is disposed a needle valve 25 capable of opening and closing of the injection hole 21. A fluid passage 27 is so disposed as to be capable of communicating with the injection hole 21 in accordance with the movement of the needle valve 25. The fluid passage 27 is coupled to an external fluid supply source, so that a fluid is supplied to the fluid passage 27 under high pressure at all times. Therefore, when the needle valve 25 is operated to open the injection hole 21, then a fluid which has been fed through the fluid passage 27 is injected to the outside or into an adjacent container, for example, a fuel chamber of an internal combustion engine (not shown).

An upper end of the needle valve 25 is a piston portion 31 which has an increased inner diameter compared with those of other portions, and the piston portion 31 is configured to slide along a cylindrical inner wall of the housing 23. Furthermore, the above-described multi-layer piezoelectric element 1 is placed within the housing 23 in contact with the piston 31.

In the injection device 19 thus constructed, upon extension of the multi-layer piezoelectric element 1 entailed by application of voltage, the piston 31 is pushed forward, thus causing the needle valve 25 to close the fluid passage 27 communicating with the injection hole 21 with a consequent halt on supply of fluid. Further, upon stopping the application of voltage, the multi-layer piezoelectric element 1 is contracted, and a disc spring 33 pushes the piston 31 backward. In consequence, the fluid passage 27 is opened and the injection hole 21 communicates with the fluid passage 27 so that injection of fluid through the injection hole 21 is carried out.

It is noted that the injection device may be so configured that the fluid passage 27 is opened by applying voltage to the multi-layer piezoelectric element 1, and is contrariwise closed by stopping the application of voltage.

Moreover, the injection device 19 of this embodiment may be so configured to include the housing 23 provided with the injection hole 21 and the multi-layer piezoelectric element 1 of the foregoing embodiment, and a fluid stored in the housing 23 is injected through the injection hole 21 by driving the multi-layer piezoelectric element 1. That is, the multi-layer piezoelectric element 1 does not necessarily have to be housed inside the housing 23, and it is thus sufficient that a pressure for the control of fluid injection can be applied to the interior of the housing 23 by driving the multi-layer piezoelectric element 1. In the injection device 19 of this embodiment, the term "fluid" is construed as encompassing not only fuel and ink, but also various matters in liquid form including an electrically-conductive paste and various matters in gaseous form. The use of the injection device 19 of this embodiment makes it possible to control the flow rate of fluid and the timing of fluid injection with stability for a long period of time.

In the case of using the injection device 19 of this embodiment employing the multi-layer piezoelectric element 1 of the foregoing embodiment for an internal combustion engine, as compared to the case of using an injection device of conventional design, a fuel can be injected into a combustion chamber of the internal combustion engine or the like with higher accuracy for a longer period of time.

Figure 11:
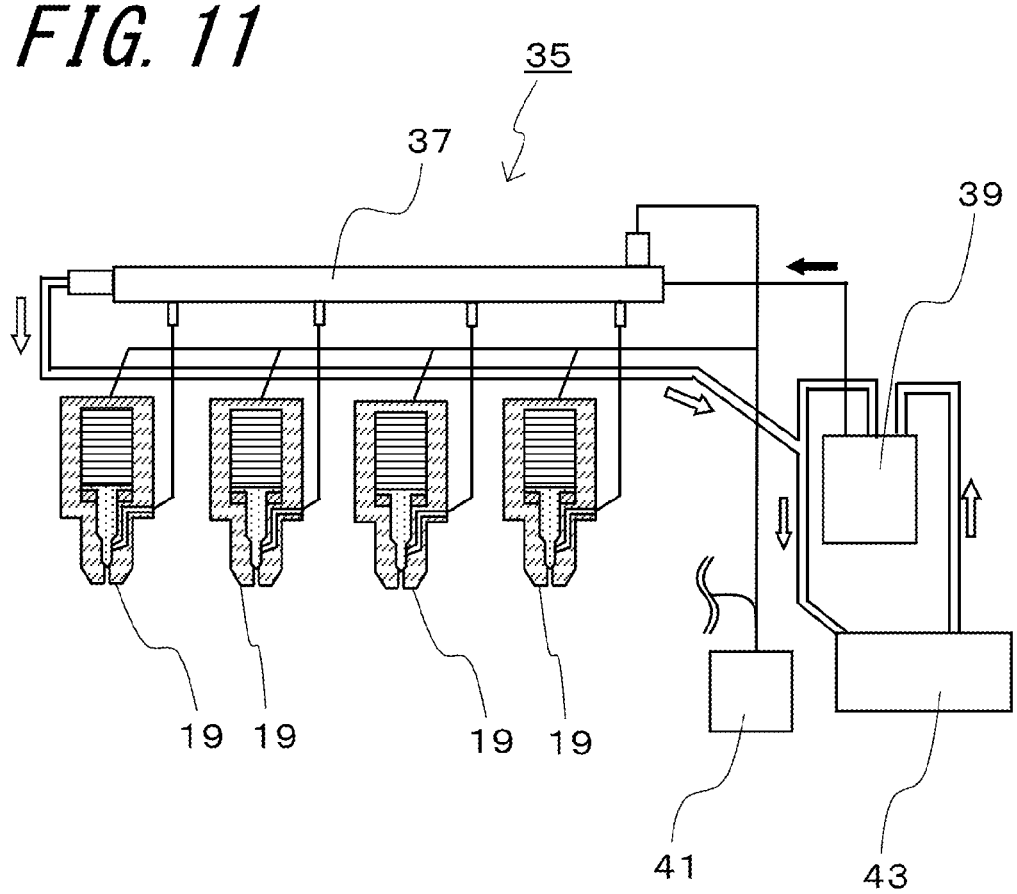
FIG. 11 is a schematic diagram showing a fuel injection system in accordance with one embodiment of the invention.

Next, a fuel injection system in accordance with the embodiment of the invention will be described. FIG. 11 is a schematic diagram showing a fuel injection system in accordance with one embodiment of the invention.

As shown in FIG. 11, the fuel injection system 35 of this embodiment includes a common rail 37 configured to store a high-pressure fuel which is a high-pressure fluid; a plurality of injection devices 19 of the foregoing embodiment, each of which is configured to inject the high-pressure fluid stored in the common rail 37; a pressure pump 39 configured to supply the high-pressure fluid to the common rail 37; and an injection control unit 41 configured to send driving signals to the injection devices 19.

The injection control unit 41 controls the amount of injection of the high-pressure fluid and injection timing on the basis of external information or external signals. For example, where the fuel injection system 35 of this embodiment is used for fuel injection into an engine, it is possible to control the amount of fuel injection and injection timing while detecting the conditions of the interior of the combustion chamber of the engine by means of a sensor or otherwise. The pressure pump 39 acts to feed a fluid fuel to the common rail 37 from a fuel tank 43 under high pressure. For example, in the fuel injection system 35 for use in engine application, the fluid fuel is fed to the common rail 37 under a pressure of as high as about 1000 to 2000 atmospheres (about 101 MPa to about 203 MPa), preferably a pressure of as high as about 1500 to 1700 atmospheres (about 152 MPa to about 172 MPa). The common rail 37 stores the high-pressure fuel which has been fed thereto from the pressure pump 39, and feeds it to the injection device 19 on an as needed basis. As has already been described, the injection device 19 injects a certain amount of fluid to the outside or into an adjacent container through the injection hole 21. For example, where a target of fuel supply by injection is an engine, the injection device injects the high-pressure fuel in a mist form into the combustion chamber of the engine through the injection hole 21.

According to the fuel injection system of this embodiment, it is possible to perform the injection of high-pressure fuel as intended for a long period of time with stability.

EXAMPLES

Hereinafter, examples of the multi-layer piezoelectric element of the invention will be described.

A piezoelectric actuator provided with the multi-layer piezoelectric element of the invention was produced in the following manner. To begin with, a ceramic slurry was prepared by mixing calcined powder of piezoelectric ceramics composed predominantly of lead zirconate titanate ($PbZrO_3$—$PbTiO_3$) having an average particle size of 0.4 µm, a binder, and a plasticizer. The ceramic slurry was formed into a 100 µm-thick piezoelectric ceramic green sheet for forming piezoelectric layers by the doctor blade method.

Then, an internal-electrode conductive paste for forming internal electrodes was prepared by adding a binder to a silver-palladium alloy. Where the silver-palladium ratio of the paste is concerned, the content of silver stands at 95% by mass, and the content of palladium stands at 5% by mass.

Subsequently, the internal-electrode conductive paste was printed to one side of the piezoelectric ceramic green sheet by the screen printing technique.

Next, 300 first piezoelectric ceramic green sheets with the printed internal electrode layer-forming conductive paste were stacked on top of each other, and the resultant was subjected to degreasing treatment at a predetermined temperature and then fired at a temperature in a range of 980 to 1100° C. thereby to obtain a stacked body. The thusly obtained stacked body was ground into a predetermined shape by a surface grinder.

Next, the metallized electrode was formed by printing a silver-glass paste prepared by adding glass, a binder, and a plasticizer to silver powder, in metallized electrode pattern, to the side face of the stacked body, with subsequent baking treatment being effected at a temperature of 700° C.

After that, a paste for forming the electrically-conductive bonding material was prepared by mixing silver powder, polyamic acid which was a precursor of polyimide, and a solvent. At this time, silver in flaky powdery form was used as the silver powder, and the mixing was carried out to obtain a cured mixture of silver powder and polyimide resin 50:50 ratio by volume.

Subsequently, after the electrically-conductive bonding material-forming paste was disposed on to the metallized electrode, the lead member was placed thereon, with subsequent drying treatment at 100° C. and curing treatment for 30 minutes and at 180° C. were effected. At this time, a component having the form as shown in FIG. 8(c) was used as the lead member.

Following the completion of curing, the electrically-conductive bonding material has been analyzed in respect of the presence of a carboxyl group (—COOH) and an imino group (—NH) by means of FT-IR spectroscopy, and the result of analysis showed that the carboxyl group (—COOH) and the imino group (—NH) did definitely exist.

In the manner as above described, a multi-layer piezoelectric element including a resin which evolves OH⁻ when being heated in accordance with the embodiment of the invention was fabricated (Sample No. 1).

Moreover, another multi-layer piezoelectric element in accordance with the embodiment of the invention was fabricated identically to Sample No. 1, except that it was not formed with the metallized electrode and thus the lead member was fixedly attached directly to the side face of the stacked body via the above-described electrically-conductive bonding material (Sample No. 2). Just as is the case with Sample No. 1, the presence of a carboxyl group (—COOH) and an imino group (—NH) in the electrically-conductive bonding material was detected.

Furthermore, still another multi-layer piezoelectric element in accordance with the embodiment of the invention was fabricated identically to Test sample 1, except that the lead member was fixedly connected to the metallized electrode via solder, and a protective layer-forming paste made of a mixture of a solvent and polyamic acid used for the electrically-conductive bonding material-forming paste in Sample No. 1 (containing no conducting material) was disposed to the side face of the stacked body by means of dipping, with subsequent drying treatment at 100° C. and curing treatment at 180° C. were effected (Sample No. 3). Note that the protective layer was formed over the entire side face of the stacked body, excluding the region formed with the metallized electrode, the electrically-conductive bonding material, and the lead member. The presence of a carboxyl group (—COOH) and an imino group (—NH) in the protective layer was detected as the result of FT-IR spectroscopy.

By way of comparison, a multi-layer piezoelectric element departing from the scope of the invention was fabricated identically to Sample No. 1, except that it used fully-imidized polyimide resin for the electrically-conductive bonding material (Sample No. 4). As the result of analysis performed on the electrically-conductive bonding material of Sample No. 4 by means of FT-IR spectroscopy, neither of a carboxyl group (—COOH) and an imino group (—NH) was detected.

In addition, by way of comparison, another multi-layer piezoelectric element departing from the scope of the invention was fabricated identically to Sample No. 3, except that it used fully-imidized polyimide resin to form the protective layer (Sample No. 5). As the result of analysis performed on the protective layer of Test sample 5 by means of FT-IR spectroscopy, neither of a carboxyl group (—COOH) and an imino group (—NH) was detected.

Next, to the respective multi-layer piezoelectric elements of Sample Nos. 1 to 5, a DC electric field of 3 kV/mm was applied via the lead member for 15 minutes to effect polarization in the piezoelectric layers.

Then, after application of DC voltage of 160 V to the respective multi-layer piezoelectric elements, in each and every multi-layer piezoelectric element (Sample Nos. 1 to 5), a displacement in an amount of 40 μm was obtained in the stacking direction of the multi-layer body.

After that, each of the multi-layer piezoelectric elements of Sample Nos. 1 to 5 was put in a metallic case, and sealed in a nitrogen-substituted atmosphere.

In running tests on the multi-layer piezoelectric elements, Sample Nos. 1 and 2 were subjected to continuous application of DC of 200 V for 1000 hours in an atmosphere at 200° C.

As the result of the above tests, the multi-layer piezoelectric elements of the examples of the invention (Sample Nos. 1, 2, and 3) showed no sign of a decrease in the amount of displacement even after continuous application of DC of 200 V for 1000 hours in an atmosphere at 200° C.

On the other hand, in the multi-layer piezoelectric elements departing from the scope of the invention (Sample Nos. 4 and 5), a 10-μm drop of the amount of displacement from the original level was observed after continuous application of DC of 200 V for 1000 hours in an atmosphere at 200° C. This is because, due to continuous operation under high-temperature and high-voltage conditions, oxygen vacancies developed in the interior of the piezoelectric layers have undergone migration so that they moved toward an electric-field concentration part (a part free of internal electrode layers of one polarity), in consequence whereof there resulted deterioration of the piezoelectric characteristics of that part of the piezoelectric layers.

REFERENCE SIGNS LIST

1: Multi-layer piezoelectric element
2: Piezoelectric layer
3: Internal electrode layer
4: Metallized electrode
5: Electrically-conductive bonding material
6: Lead member
7: Stacked body
8: Protective layer
10: Case
19: Injection device
21: Injection hole
23: Housing (container)
25: Needle valve
27: Fluid passage
29: Cylinder
31: Piston
33: Disc spring
35: Fuel injection system
37: Common rail
39: Pressure pump
41: Injection control unit
43: Fuel tank

What is claimed is:
1. A multi-layer piezoelectric element, comprising:
a stacked body including piezoelectric layers and internal electrode layers which are stacked on each other, and comprising a side face; and a resin disposed on the side face, wherein the resin is an incompletely-imidized polyimide resin or incompletely-amidated polyamide resin and the resin evolves OH⁻ when heated.

2. The multi-layer piezoelectric element according to claim 1, further comprising:
an external electrode attached to the side face of the stacked body, and electrically connected to the internal electrode layers,
wherein the resin is disposed to a surface of the external electrode.

3. The multi-layer piezoelectric element according to claim 1, further comprising:
an external electrode attached to the side face of the stacked body, and electrically connected to the internal electrode layers; and
an electrically-conductive bonding material and a lead member that are electrically connected to the external electrode,
wherein the electrically-conductive bonding material contains a conducting material and the resin.

4. The multi-layer piezoelectric element according to claim 1, further comprising:
an electrically-conductive bonding material and a lead member that are attached to the side face of the stacked body, and electrically connected to the internal electrode layers,
wherein the electrically-conductive bonding material contains a conducting material and the resin.

5. The multi-layer piezoelectric element according to claim 3,
wherein the conducting material is made of one or more metals selected from Ag, Au, Pt and Pd, or an alloy including the one or more metals.

6. The multi-layer piezoelectric element according to claim 1,
wherein the resin is deposited on the side face of the stacked body, and serves as a protective layer.

7. The multi-layer piezoelectric element according to claim 1,
wherein the resin is the incompletely-imidized polyimide resin and has a carboxyl group and an imino group as unreacted components,
wherein a rate of imidization of the resin falls in a range of 80% to 98%.

8. The multi-layer piezoelectric element according to claim 3,
wherein the lead member has a plate shape including slits or holes, a mesh structure, or a comb structure, and is extendable and contractable in a stacking direction of the stacked body.

9. A piezoelectric actuator, comprising:
the multi-layer piezoelectric element according to claim 1; and
a case for accommodating the multi-layer piezoelectric element in its interior.

10. An injection device, comprising:
a container provided with an injection hole; and
the multi-layer piezoelectric element according to claim 1,
a fluid stored in the container being injected through the injection hole by driving the multi-layer piezoelectric element.

11. A fuel injection system, comprising:
a common rail configured to store a high-pressure fuel;
the injection device according to claim 10, the injection device being configured to inject the high-pressure fuel stored in the common rail;
a pressure pump configured to supply the high-pressure fuel to the common rail; and
an injection control unit configured to send driving signals to the injection device.

12. The multi-layer piezoelectric element according to claim 4,
wherein the conducting material is made of one or more metals selected from Ag, Au, Pt and Pd, or an alloy including the one or more metals.

13. The multi-layer piezoelectric element according to claim 4,
wherein the lead member has a plate shape including slits or holes, a mesh structure, or a comb structure, and is extendable and contractable in a stacking direction of the stacked body.

* * * * *